Nov. 26, 1968 C. H. FERNALD ET AL 3,413,594

EDGE CONNECTOR

Filed Aug. 2, 1966

United States Patent Office 3,413,594
Patented Nov. 26, 1968

3,413,594
EDGE CONNECTOR

Charles Henry Fernald, Lancaster, and Edward Michael Poltonavage, Palmyra, Pa., assignors to AMP Incorporated, Harrisburg, Pa.

Filed Aug. 2, 1966, Ser. No. 569,746
1 Claim. (Cl. 339—176)

ABSTRACT OF THE DISCLOSURE

The disclosure relates to an edge connector for printed circuit boards or the like. The edge connector comprises an insulating housing having openings for receiving spring terminals. The terminals are staked in the housing and are configured to engage pin members from a connecting board and conductive strips on a printed circuit board.

In the electronic field there are a large number of electrical systems which require the interconnection of many memory boards or printed circuit boards. As is often the case there are a plurality of boards arranged in parallel fashion to be connected to a large memory board or mother board and the simplest arrangement is to connect the mother board at right angles to the parallel printed circuit boards or daughter boards.

The prior art offers many configurations for accomplishing the above purpose. The most common type of prior art connector utilizes a multi-contact housing wherein the contacts within the housing each have a pair of tabs, one of which will be soldered to the daughter board while the other of which will be soldered to a socket or the like in the mother board. The magnitude of the connection problem can be appreciated when it is realized that a typical memory board will have forty or more daughter boards attached thereto with each daughter board having two hundred or more contact points. This means there are well over ten thousand solder connections to be made in order to complete the circuit. It can be easily appreciated that in such a connection system there are severe maintenance problems. If but one of the boards fails and must be replaced all of the solder joints must be disconnected in order to remove the appropriate board. The faulty board would then be replaced and five thousand or more connections would need soldering. This is a very slow and tedious task.

The instant invention overcomes the deficiencies of the prior art devices by providing an edge connector which becomes permanently secured to a particular printed circuit board and which is plugably connectable with a mother board. In such a connection system any individual board can be unplugged from the mother board and replaced in a minimum of time and with a maximum degree of reliability.

It is therefore a principal object of the present invention to provide an edge connector for a printed circuit board or the like.

A further object is to provide a connector which permits rapid assembly and which minimizes maintenance difficulties.

Another object is to provide a connector which is of simple construction and yet is rugged and reliable in operation.

Other objects and attainments of the present invention will become apparent to those skilled in the art upon a reading of the following detailed description when taken in conjunction with the drawings in which there is shown and described an illustrative embodiment of the invention; it is to be understood, however, that this embodiment is not intended to be exhaustive nor limiting of the invention but is given for purpose of illustration in order that others skilled in the art may fully understand the invention and the principles thereof and the manner of applying it in practical use so that they may modify it in various forms, each as may be best suited to the conditions of a particular use.

In the drawings, in which like reference numerals refer to like parts:

Figures 1, 2, 3, 4, 5, 6, 7:
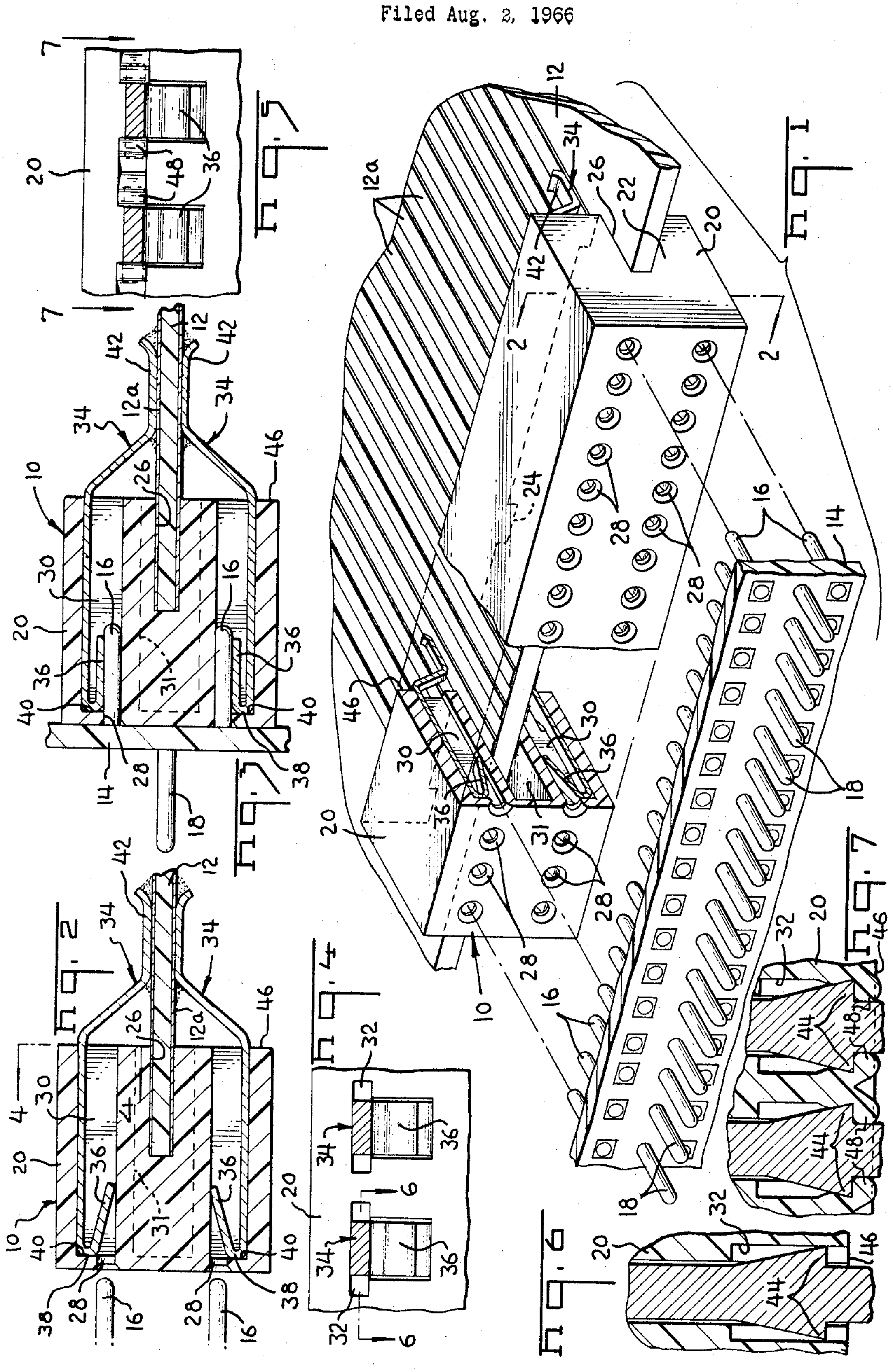
FIGURE 1 is an overall perspective view showing the edge connector of the instant invention.
FIGURE 2 is a cross-sectional view taken along the line 2—2 of FIGURE 1 and showing the connector prior to engagement with the mother board.
FIGURE 3 is a cross-sectional view similar to FIGURE 2 but showing the connector in mating engagement with the mother board.
FIGURE 4 is an enlarged fragmentary view partly in section taken along the line 4—4 of FIGURE 2 and showing the contact members prior to securement within their associated housing.
FIGURE 5 is a view similar to FIGURE 4 but showing the contacts after securement in the housing.
FIGURE 6 is a cross-sectional view taken along the line 6—6 of FIGURE 4 showing further details of the contact members.
FIGURE 7 is a cross-sectional view taken along the line 7—7 of FIGURE 5 showing details of the contact members and their means of securement within the housing.

In FIGURE 1 there is shown a connector assembly 10 mounted on one edge of a printed circuit board or the like 12. It is to be understood that the connector assembly 10 may be of any appropriate length and there may be a plurality of such assemblies mounted along the edge of the printed circuit board. A large memory board or mother board 14 is provided and has a plurality of contact pins 16 disposed on one side thereof for mating engagement with the connector assembly 10 and a second plurality of pins 18 disposed on the opposite side of board 14 from the pins 16, the pins 18 being provided for connection with appropriate external circuitry.

The connector assembly 10 comprises a housing 20 of insulating material such as nylon or the like and is adapted to be received over the edge of a printed circuit board. The housing 20 has a pair of end faces 22 and one or more intermediate web portions 24, both the end faces and the webs having rectangular slots 26 of appropriate size for receiving the edge of a printed circuit board. A plurality of regularly spaced apertures 28 are provided on one side of the housing 20 and are adapted to receive the contact pins 16 on the board 14. The apertures 28 communicate with enlarged rectangular openings 30 formed in the housing. The apertures are preferably made tangent with the inside face of the rectangular openings. At the end of the rectangular openings remote from the apertures 28 there is provided relieved portions 32 (see FIGURE 4) for a purpose to be described. In order to lighten the housing 20 and to use a minimum of insulating material there are provided enlarged recesses 31 formed between the end faces 22 and the webs 24. In this way the printed circuit board is supported only at the spaced points defined by the end faces and the webs.

A pair of spring terminals or contact members 34 are provided in association with each vertical pair of apertures 28. The contacts 34 are formed of resilient metal such as brass or phosphor bronze and may be appropriately plated with gold, tin or the like in order to improve the electrical characteristics of the contact.

Each spring terminal 34 is a unitary piece and comprises a reversely bent portion 36 and a shoulder 38. The shoulder 38 cooperates with a depending portion 40 on the housing for limiting the insertion of the terminal into the housing openings 30. The portion 36 of the terminals is adapted to make contact with the pins 16 of the board 14 when the said pins are inserted into the housing apertures 28. As seen in FIGURE 3 the pins will be firmly engaged between the terminal portions 36 and the inner side of the housing apertures 30. By this means the housing provides a backing force which acts against the terminal portion 36 for insuring good electrical contact between the terminal and the pin.

Each terminal is also provided with a tab portion 42 adapted to be positioned over a circuitry strip 12*a* on the printed circuit board 12. The tab portion 42 may be soldered to the strip 12*a* to insure a permanent high quality electrical connection. As can be seen in FIGURES 2 and 3 each pair of terminals 34 is connected to a circuitry strip on both sides of the printed circuit board.

The manner in which the terminals 34 are secured within the housing 20 will now be described. With reference to FIGURES 4 and 6 each terminal is shown as being provided with a pair of lateral abutments 44 positioned so as to lie just within the surface 46 on the housing 20. The abutments 44 lie within the enlarged recesses 32 previously described. When the terminals 34 are in place within the housing 20 a staking tool is applied to the housing in the area lying between each of adjacent terminals. As seen in FIGURES 5 and 7 the staking tool penetrates the surface of the housing and causes the housing material to be displaced laterally to a position whereat the deformed material 48 overlies the abutments 44 on the terminals. In this manner the terminals cannot be withdrawn from the housing and are permanently secured therein.

It can be seen from the connector assembly described above that a system has been provided which is of simple construction yet allows rapid interconnection between a large number of circuit boards. When the boards 12 are placed within the housings 20 and secured to the spring terminals 34 by solder or the like the connector assemblies become an integral part of the circuit board. When the particular board 12 is to be assembled in an overall system with the motor board 14 it is merely necessary to plug the contact pins 16 into the apertures 28 of the housing to make contact with the terminal portions 36. The system will be continued by connecting the pins 18 of the mother board to appropriate external circuitry as may be desired.

Changes in construction will occur to those skilled in the art and various apparently different modifications and embodiments may be made without departing from the scope of the invention. The matter set forth in the foregoing description and accompanying drawings is offered by way of illustration only. The actual scope of the invention is intended to be defined in the following claim when viewed in its proper perspective against the prior art.

What is claimed is:

1. A connector for a printed circuit board or the like comprising an insulating housing, a plurality of pairs of apertures disposed along one side of said housing and adapted to receive pin members therein, a plurality of pairs of terminal receiving openings disposed along a second side of said housing opposite to said one side and having enlarged areas adjacent said second side, each of said openings communicating with a respective one of said apertures, a plurality of pairs of spring terminals disposed in said pairs of openings, each said spring terminal comprising a first portion located adjacent said apertures and a second portion extending outwardly from said second side o fsaid housing, printed circuit board receiving means disposed in said housing between the openings of said pairs of openings whereby said terminal second portions are engageable with conductive strips on a printed circuit board disposed in said receiving means, said terminal first portions being reversely bent to extend generally in the direction of said second portions and adapted to engage pin members inserted into said housing apertures, said first portions cooperating with a surface of said openings coincident with said apertures to hold the pin members therebetween, means on said terminals for limiting movement of said terminals into said housing, and additional means on said terminals for preventing withdrawal of said terminals from said housing, said additional means comprising lateral abutments on each said terminal disposed in said enlarged areas of said openings, and said housing having portions lying between said openings, which portions are cold-formed to overlie said lateral abutments to thereby lock the said terminals in said housing.

References Cited

UNITED STATES PATENTS

| | | | |
|---|---|---|---|
| 2,903,504 | 9/1959 | Tuck | 339—220 X |
| 2,933,007 | 4/1960 | Healy | 339—220 X |
| 3,201,617 | 8/1965 | Pacoroni et al. | 339—154 X |
| 3,253,246 | 5/1966 | McConnell et al. | 339—17 |
| 3,320,572 | 5/1967 | Schwartz | 339—176 X |

MARVIN A. CHAMPION, *Primary Examiner.*

J. R. MOSES, *Assistant Examiner.*